(12) United States Patent
Liu et al.

(10) Patent No.: US 9,940,989 B2
(45) Date of Patent: Apr. 10, 2018

(54) STT-MRAM CELL STRUCTURES

(71) Applicant: Micron Technology, Inc., Boise, ID (US)

(72) Inventors: Jun Liu, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/421,204

(22) Filed: Jan. 31, 2017

(65) Prior Publication Data

US 2017/0140806 A1    May 18, 2017

Related U.S. Application Data

(62) Division of application No. 14/595,955, filed on Jan. 13, 2015, now Pat. No. 9,595,664, which is a division
(Continued)

(51) Int. Cl.
*G11C 11/00* (2006.01)
*G11C 11/16* (2006.01)
(Continued)

(52) U.S. Cl.
CPC .......... *G11C 11/1675* (2013.01); *G11C 11/16* (2013.01); *G11C 11/161* (2013.01);
(Continued)

(58) Field of Classification Search
CPC .... G11C 11/161; G11C 11/1675; G11C 11/16
See application file for complete search history.

(56) References Cited

U.S. PATENT DOCUMENTS 6,379,978 B2    4/2002   Goebel et al.
6,424,563 B2    7/2002   Honigschmid
(Continued)

FOREIGN PATENT DOCUMENTS

WO    WO2008010957    1/2008

OTHER PUBLICATIONS

Korean Office Action for KR Application No. 10-2011-7018589 dated Mar. 16, 2016.
(Continued)

*Primary Examiner* — Tuan T Nguyen
(74) *Attorney, Agent, or Firm* — Fletcher Yoder, P.C.

(57) ABSTRACT

A magnetic cell structure including a nonmagnetic bridge, and methods of fabricating the structure are provided. The magnetic cell structure includes a free layer, a pinned layer, and a nonmagnetic bridge electrically connecting the free layer and the pinned layer. The shape and/or configuration of the nonmagnetic bridge directs a programming current through the magnetic cell structure such that the cross sectional area of the programming current in the free layer of the structure is less than the cross section of the structure. The decrease in the cross sectional area of the programming current in the free layer enables a lower programming current to reach a critical switching current density in the free layer and switch the magnetization of the free layer, programming the magnetic cell.

20 Claims, 13 Drawing Sheets

Related U.S. Application Data of application No. 14/037,064, filed on Sep. 25, 2013, now Pat. No. 8,945,950, which is a division of application No. 12/351,517, filed on Jan. 9, 2009, now Pat. No. 8,553,449.

(51) Int. Cl.

| | | |
|---|---|---|
| *H01L 29/66* | (2006.01) | |
| *H01L 43/12* | (2006.01) | |
| *H01L 43/02* | (2006.01) | |
| *H01L 43/08* | (2006.01) | |

(52) U.S. Cl.
CPC .... *G11C 11/1659* (2013.01); *H01L 29/66007* (2013.01); *H01L 43/02* (2013.01); *H01L 43/08* (2013.01); *H01L 43/12* (2013.01)

(56) References Cited

U.S. PATENT DOCUMENTS

| | | | |
|---|---|---|---|
| 6,490,217 | B1 | 12/2002 | DeBrosse et al. |
| 6,683,763 | B1 | 1/2004 | Hiner et al. |
| 6,847,547 | B2 | 1/2005 | Albert et al. |
| 6,867,175 | B2 | 3/2005 | Engelhardt et al. |
| 6,896,975 | B2 | 5/2005 | Lin et al. |
| 6,982,916 | B2 | 1/2006 | Tsang |
| 6,992,359 | B2 | 1/2006 | Nguyen et al. |
| 7,009,877 | B1 | 3/2006 | Huai et al. |
| 7,042,762 | B2 | 5/2006 | Nakamura et al. |
| 7,045,368 | B2 | 5/2006 | Hong et al. |
| 7,088,609 | B2 | 8/2006 | Valet |
| 7,126,202 | B2 | 10/2006 | Huai et al. |
| 7,211,874 | B2 | 5/2007 | Guo et al. |
| 7,224,601 | B2 | 5/2007 | Panchula |
| 7,230,844 | B2 | 6/2007 | Deak |
| 7,257,021 | B2 | 8/2007 | Lienau et al. |
| 7,282,755 | B2 | 10/2007 | Pakala et al. |
| 7,307,876 | B2 | 12/2007 | Kent et al. |
| 7,310,265 | B2 | 12/2007 | Zheng et al. |
| 7,339,819 | B2 | 3/2008 | Johnson |
| 7,372,722 | B2 | 5/2008 | Jeong et al. |
| 7,419,891 | B1 | 9/2008 | Chen et al. |
| 7,430,135 | B2 | 9/2008 | Huai et al. |
| 7,433,161 | B2 | 10/2008 | Lkarashi et al. |
| 7,649,239 | B2 | 1/2010 | Hussein |
| 8,767,454 | B2 | 7/2014 | Liu et al. |
| 2004/0165453 | A1* | 8/2004 | Nakajima ............... G11C 11/15 365/200 |
| 2005/0057992 | A1 | 3/2005 | Yagami |
| 2005/0136600 | A1 | 6/2005 | Huai |
| 2006/0002184 | A1 | 1/2006 | Hong et al. |
| 2006/0114716 | A1 | 6/2006 | Kai et al. |
| 2006/0183002 | A1 | 8/2006 | Yang et al. |
| 2006/0192237 | A1 | 8/2006 | Huai |
| 2006/0262594 | A1 | 11/2006 | Fukumoto |
| 2007/0133251 | A1 | 6/2007 | Carey et al. |
| 2007/0243638 | A1 | 10/2007 | Horng et al. |
| 2007/0267667 | A1* | 11/2007 | Ufert ................ H01L 27/2436 257/295 |
| 2007/0291530 | A1 | 12/2007 | Katti |
| 2008/0049488 | A1 | 2/2008 | Rizzo |
| 2008/0061388 | A1 | 3/2008 | Diao et al. |
| 2008/0150640 | A1 | 6/2008 | Dimitrov et al. |
| 2008/0179699 | A1 | 7/2008 | Horng et al. |
| 2008/0180991 | A1 | 7/2008 | Wang |
| 2008/0197431 | A1 | 8/2008 | Morise et al. |
| 2008/0225577 | A1 | 9/2008 | Hosotani et al. |
| 2008/0258125 | A1 | 10/2008 | Liu et al. |
| 2008/0277703 | A1 | 11/2008 | Iwayama |
| 2009/0085058 | A1 | 4/2009 | Mather et al. |
| 2009/0104718 | A1 | 4/2009 | Zhong et al. |
| 2009/0108383 | A1 | 4/2009 | Horng et al. |
| 2009/0122450 | A1 | 5/2009 | Wang et al. |
| 2009/0229111 | A1 | 9/2009 | Zhao et al. |
| 2009/0251829 | A1 | 10/2009 | Zhang et al. |
| 2009/0256220 | A1 | 10/2009 | Horng et al. |
| 2010/0240151 | A1 | 9/2010 | Belen et al. |
| 2010/0315863 | A1 | 12/2010 | Zhu et al. |
| 2011/0008915 | A1 | 1/2011 | Nozieres et al. |
| 2012/0032289 | A1 | 2/2012 | Ohmori et al. |
| 2012/0156390 | A1 | 6/2012 | Araki et al. |
| 2013/0069184 | A1 | 3/2013 | Aikawa et al. |
| 2013/0130406 | A1 | 5/2013 | Zhu et al. |
| 2014/0211557 | A1 | 7/2014 | Ong et al. |
| 2014/0217487 | A1 | 8/2014 | Guo |
| 2015/0021726 | A1 | 1/2015 | Min et al. |

OTHER PUBLICATIONS

Kim, B. "Modeling etch rate an uniformity of oxide via etching in a CHF3/CF4 plasma using neural networks" Thin Solid Films vol. 426 Feb. 4, 2003 pp. 8-15.
Creighton, J. R. "Chemical Vapor Deposition" Chapter 1: Introduction to Chemical Vapor Deposition (CVD) Jun. 2001 pp. 1-3.
Nagasaka, K. "CPP-GMR Technology for Future High-Density Magnetic Recording" Fujitsu Sci Tech J. Jan. 2006 pp. 149-157.
STIC, Search Report EIC-2800, 8 Pages.

* cited by examiner

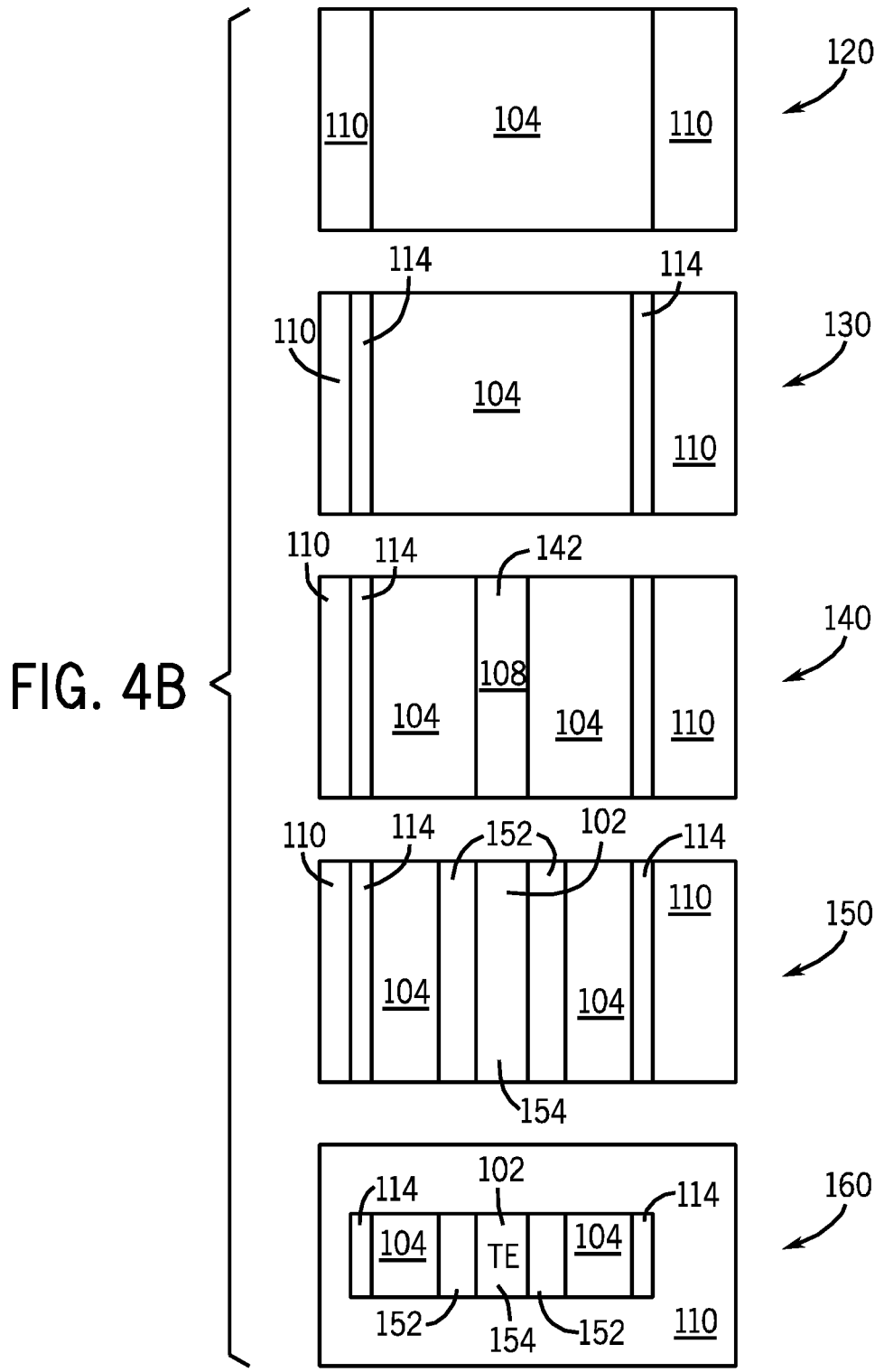

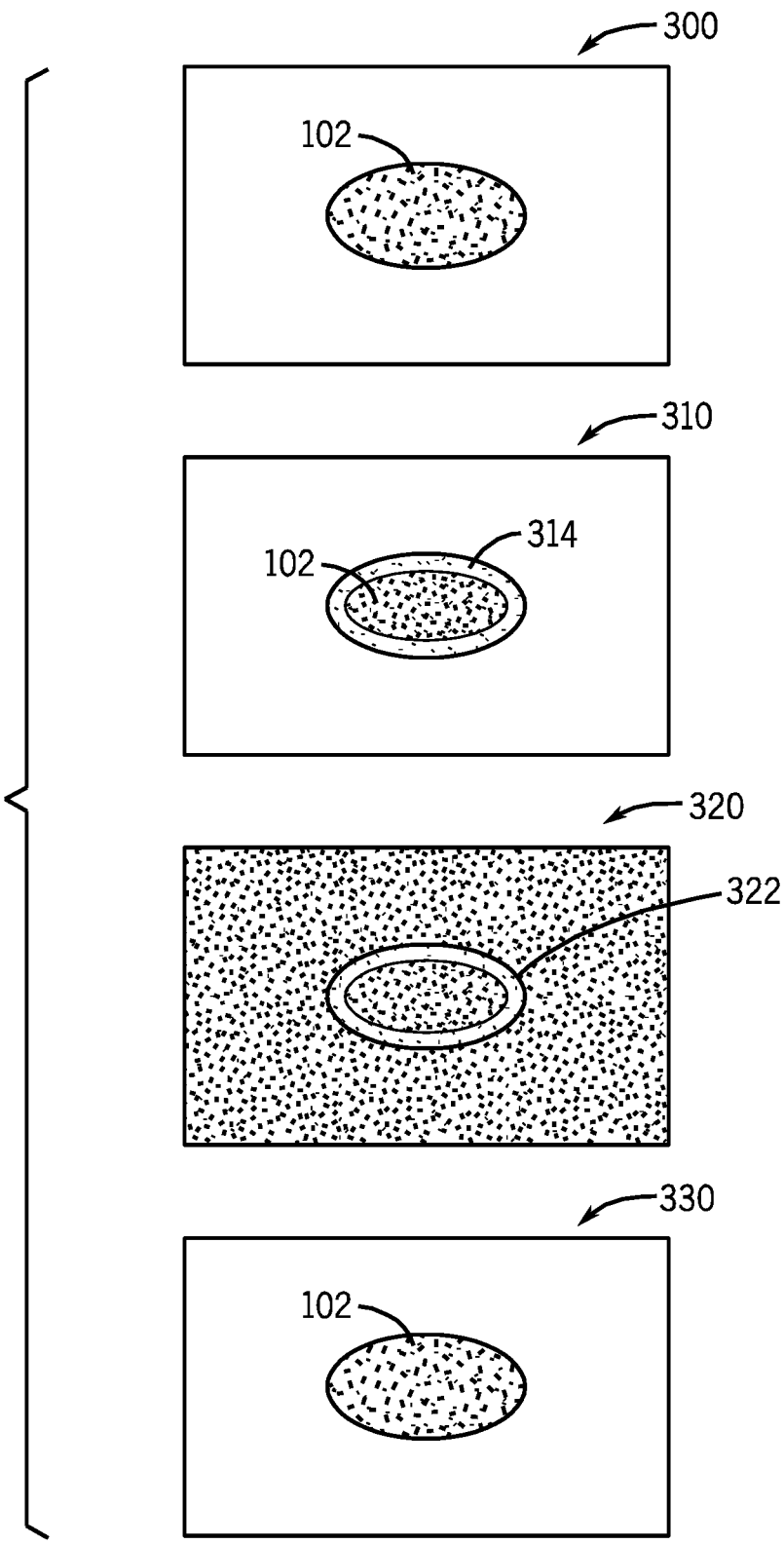

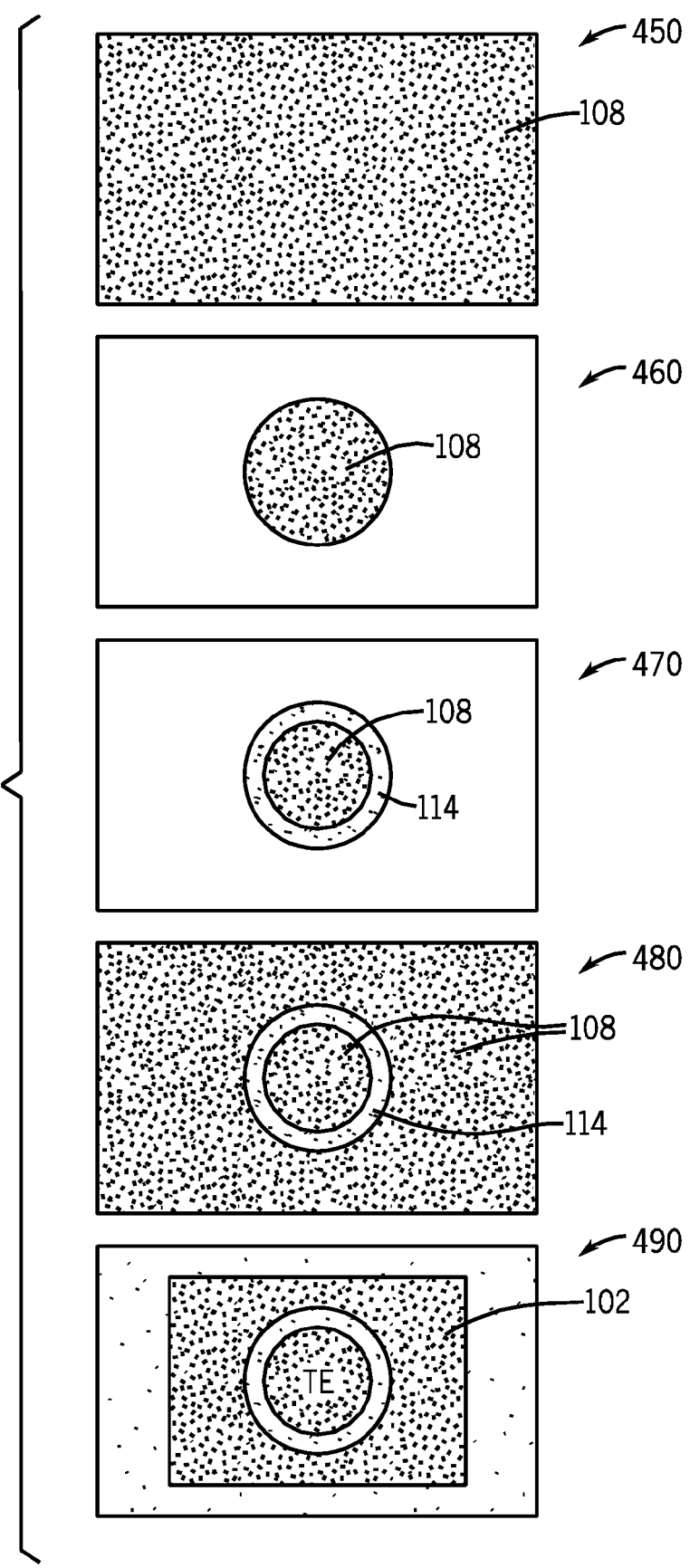

STT-MRAM CELL STRUCTURES

CROSS-REFERENCE TO RELATED APPLICATION

This application is a divisional of U.S. patent application Ser. No. 14/595,955, which was filed on Jan. 13, 2015, which is a divisional of U.S. patent application Ser. No. 14/037,064, which was filed on Sep. 25, 2013, now U.S. Pat. No. 8,945,950, which issued on Feb. 3, 2015, which is a divisional of U.S. patent application Ser. No. 12/351,517, which was filed on Jan. 9, 2009, now U.S. Pat. No. 8,553,449, which issued on Oct. 8, 2013.

BACKGROUND

Field of Invention

The invention relates generally to magnetic random access memory, and more particularly, to Spin Torque Transfer Magnetic Random Access Memory (STT-MRAM).

Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

Magnetic Random Access Memory (MRAM) is a non-volatile computer memory technology based on magnetoresistance. MRAIVI differs from volatile Random Access Memory (RAM) in several respects. Because MRAIVI is non-volatile, MRAM can maintain memory content when the memory device is not powered. Though non-volatile RAM is typically slower than volatile RAM, MRAM has read and write response times that are comparable to that of volatile RAM. Unlike typical RAM technologies which store data as electric charge, MRAIVI data is stored by magnetoresistive elements. Generally, the magnetoresistive elements are made from two magnetic layers, each of which holds a magnetization. The magnetization of one layer (the "pinned layer") is fixed in its magnetic orientation, and the magnetization of the other layer (the "free layer") can be changed by an external magnetic field generated by a programming current. Thus, the magnetic field of the programming current can cause the magnetic orientations of the two magnetic layers to be either parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the typical MRAM cell.

Though MRAM technology offers non-volatility and faster response times, the MRAM cell is limited in scalability and susceptible to write disturbances. The programming current employed to switch between high and low resistance states across the MRAM magnetic layers is typically high. Thus, when multiple cells are arranged in an MRAM array, the programming current directed to one memory cell may induce a field change in the free layer of an adjacent cell. This potential for writes disturbances, also known as the "half-select problem," can be addressed using a spin torque transfer technique.

A conventional spin torque transfer MRAM (STT-MRAM) cell may include a magnetic cell stack, which may be a magnetic tunnel junction (MTJ) or a spin valve structure. An MTJ is a magnetoresistive data storing element including two magnetic layers (one pinned and one free) and an insulating layer in between, a bit line, a word line, a source line, and an access transistor. A spin valve has a structure similar to the MTJ, except a spin valve has a conductive layer in between the two magnetic layers. A programming current typically flows through the access transistor and the magnetic cell stack. The pinned layer polarizes the electron spin of the programming current, and torque is created as the spin-polarized current passes through the stack. The spin-polarized electron current interacts with the free layer by exerting a torque on the free layer. When the torque of the spin-polarized electron current passing through the stack is greater than the critical switching current density ($J_c$), the torque exerted by the spin-polarized electron current is sufficient to switch the magnetization of the free layer. Thus, the magnetization of the free layer can be aligned to be either parallel or antiparallel to the pinned layer, and the resistance state across the stack is changed.

The STT-MRAM has advantageous characteristics over the MRAM, because the spin-polarized electron current eliminates the need for an external magnetic field to switch the free layer in the magnetoresistive elements. Further, scalability is improved as the programming current decreases with decreasing cell sizes, and the writing disturbance and half-select problem is addressed. Additionally, STT-MRAM technology allows for a higher tunnel magnetic resistance ratio, meaning there is a larger ratio between high and low resistance states, improving read operations in the magnetic domain.

However, high programming current densities through the STT-MRAM cell may still be problematic. High current densities through the magnetic layers may increase the energy consumption in the cell and the thermal profile in the layers, affecting the cell's integrity and reliability, and may also lead to larger silicon real estate consumption for each cell.

BRIEF DESCRIPTION OF DRAWINGS

Certain embodiments are described in the following detailed description and in reference to the drawings in which:

FIGS. 4A and 4B depict side views and top views of fabricating the magnetic cell structure depicted in FIGS. 3A and 3B;

FIGS. 6A and 6B depict side views and top views of fabricating another magnetic cell structure with nonmagnetic material connecting a free layer and a pinned layer in accordance with embodiments of the present invention;

FIGS. 8A and 8B depict side views and top views of another method of fabricating the magnetic cell structure fabricated in FIGS. 7A and 7B in accordance with embodiments of the present invention.

DETAILED DESCRIPTION

As previously discussed, a spin torque transfer magnetic random access memory (STT-MRAM) cell is programmed by switching the magnetization of the free layer in the cell's magnetic cell stack. Switching occurs when the current density passing through the memory cell is larger than the critical switching current density. Thus, to program the cell, the programming current density need only be slightly higher than the critical switching current density. Since passing a larger programming current increases the energy consumption and the thermal profile in the cell stack, which affects the integrity and reliability of the cell, it is desirable to decrease the critical switching current without affecting the cell's thermal stability. Applying a lower programming current while maintaining a programming current density that is above the critical switching current density would allow a smaller current to switch the free layer of the cell. The following discussion describes the systems and devices, and the operation of such systems and devices in accordance with the embodiments of the present technique.

Figure 1:
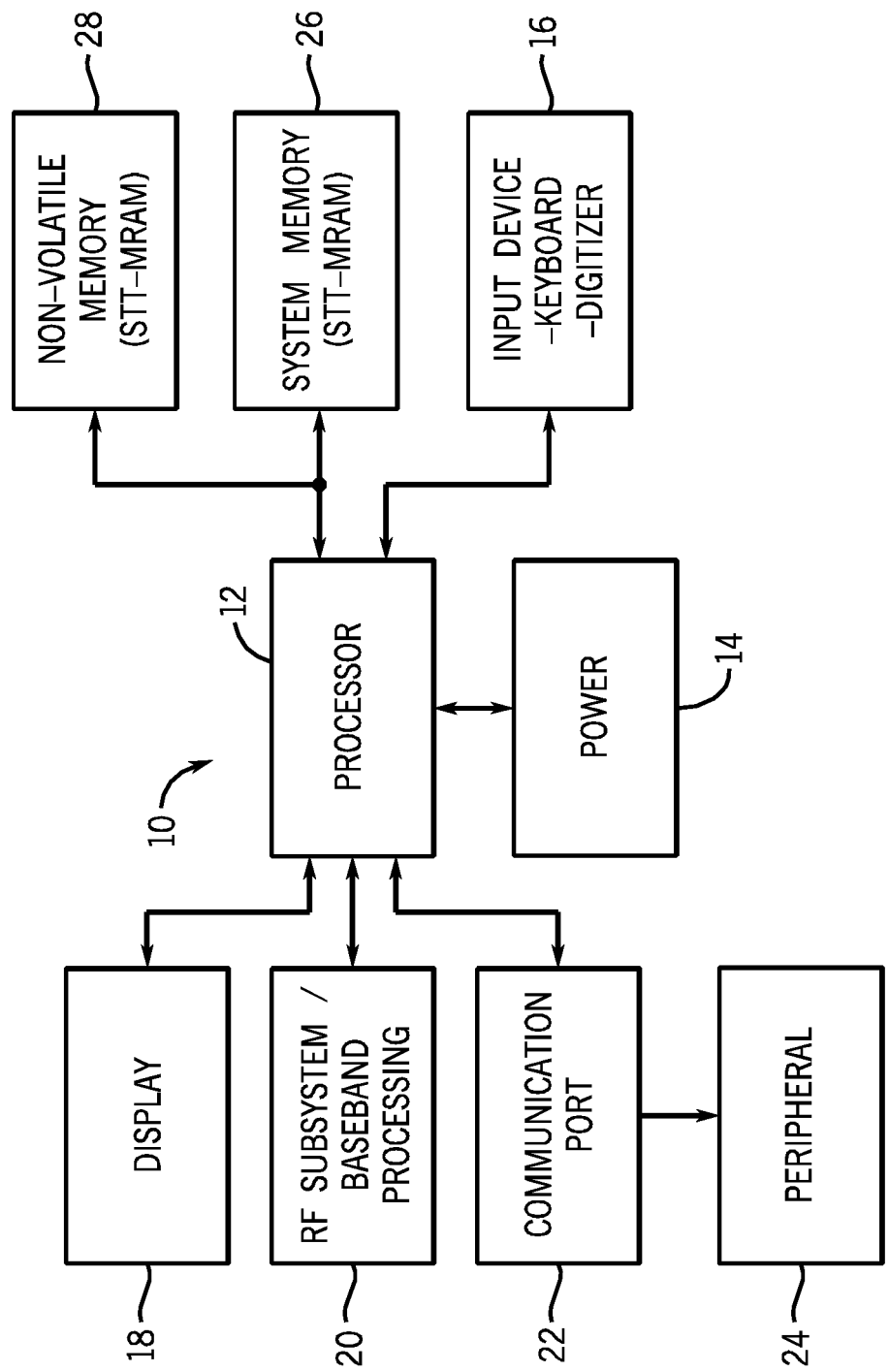
FIG. 1 depicts a block diagram of a processor-based system in accordance with an embodiment of the present technique.

FIG. 1 depicts a processor-based system, generally designated by reference numeral 10. As is explained below, the system 10 may include various electronic devices manufactured in accordance with embodiments of the present technique. The system 10 may be any of a variety of types such as a computer, pager, cellular phone, personal organizer, control circuit, etc. In a typical processor-based system, one or more processors 12, such as a microprocessor, control the processing of system functions and requests in the system 10. As is explained below, the processor 12 and other subcomponents of the system 10 may include resistive memory devices manufactured in accordance with embodiments of the present technique.

The system 10 typically includes a power supply 14. For instance, if the system 10 is a portable system, the power supply 14 may advantageously include a fuel cell, a power scavenging device, permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, a digitizer and stylus, and/or a voice recognition system, for instance. A display 18 may also be coupled to the processor 12. The display 18 may include an LCD, an SED display, a CRT display, a DLP display, a plasma display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The software programs may include an operating system, database software, drafting software, word processing software, and/or video, photo, or sound editing software, for example. The memory is operably coupled to the processor 12 to store and facilitate execution of various programs. For instance, the processor 12 may be coupled to the system memory 26, which may include spin torque transfer magnetic random access memory (STT-MRAM), magnetic random access memory (MRAM), dynamic random access memory (DRAM), and/or static random access memory (SRAM). The system memory 26 may include volatile memory, non-volatile memory, or a combination thereof. The system memory 26 is typically large so that it can store dynamically loaded applications and data. In some embodiments, the system memory 26 may include STT-MRAM devices, such as those discussed further below.

The processor 12 may also be coupled to non-volatile memory 28, which is not to suggest that system memory 26 is necessarily volatile. The non-volatile memory 28 may include STT-MRAM, MRAM, read-only memory (ROM), such as an EPROM, resistive read-only memory (RROM), and/or flash memory to be used in conjunction with the system memory 26. The size of the ROM is typically selected to be just large enough to store any necessary operating system, application programs, and fixed data. Additionally, the non-volatile memory 28 may include a high capacity memory such as a tape or disk drive memory, such as a hybrid-drive including resistive memory or other types of non-volatile solid-state memory, for instance. As is explained in greater detail below, the non-volatile memory 28 may include STT-MRAM devices manufactured in accordance with embodiments of the present technique.

Figure 2:
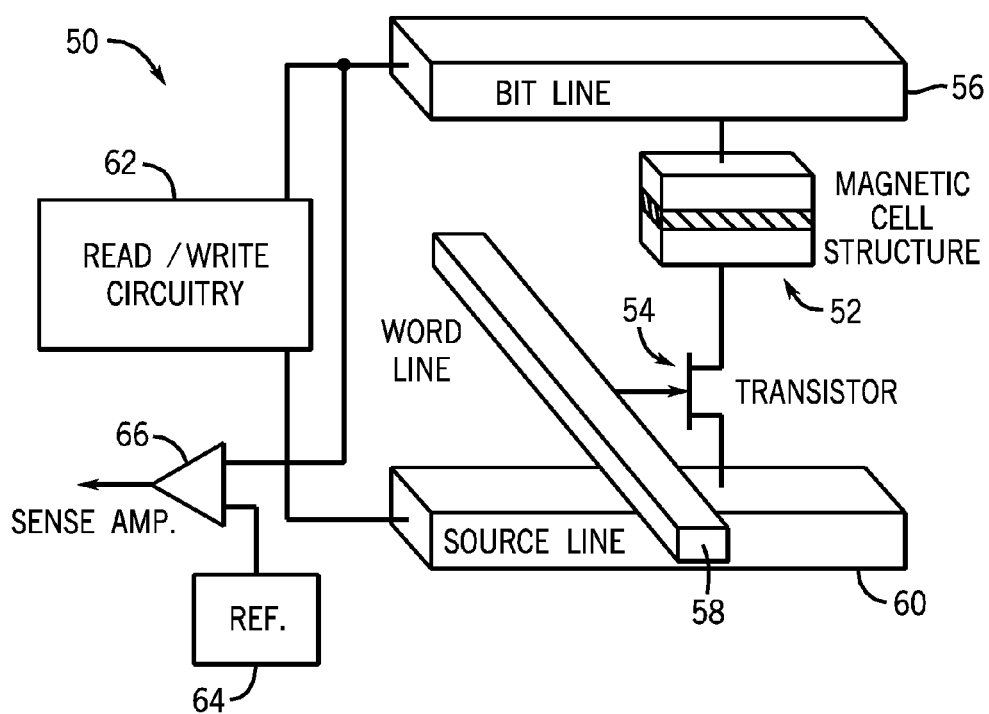
FIG. 2 depicts a schematic diagram of a portion of a memory array having memory cells fabricated in accordance with embodiments of the present invention.

FIG. 2 illustrates an STT-MRAM cell 50, which may be fabricated to form an array of memory cells in a grid pattern including a number of rows and columns, or in various other arrangements depending on the system requirements and fabrication technology. An arrangement of memory cells may be implemented in the system memory 26 or the volatile memory 28 depicted in FIG. 1.

The STT-MRAM cell 50 includes a magnetic cell structure 52, an access transistor 54, a bit line 56, a word line 58, a source line 60, read/write circuitry 62, a bit line reference 64, and a sense amplifier 66. The magnetic cell structure 52 may include a spin valve. As will be described further below with specific reference to FIGS. 3A-8B, the structure 52 may further include a nonmagnetic bridge between the free and pinned layers in accordance with embodiments of the present technique. In various embodiments described below, the nonmagnetic bridge in the structure 52 may be layers disposed within or around the structure 52, or layered along the structure 52 (FIGS. 3A-8B).

As used herein, the STT-MRAM cell 50 generally includes a "magnetic cell structure." The magnetic cell structure may be a spin valve, as discussed above, if a nonmagnetic conductive material is between a free layer and a pinned layer. As used in the present specification, the term "structure" may include a magnetic cell structure, and may refer to a memory cell structure, magnetic cell structure, STT-MRAM cell structure, or any component of a memory cell which may include layers and materials in accordance with an embodiment of the present technique. Furthermore, the term "structure" may refer to transitional structures during processes to fabricate the magnetic cell structure of the present techniques.

As will be explained, the term "bridge" may refer to a layer, a liner, a spacer, a strip, or some other formation which provides a path or electrical connection between the free and pinned layers. The bridge may be parallel or perpendicular to the structure (i.e., the layers of the structure), and may be formed by deposition, growth, or any other process(es) in accordance with embodiments of the present technique. As also used herein, materials may be referred to as a "layer" when the material is formed above or below the structure or within the structure (e.g., a liner or a strip). A layer may be either parallel or perpendicular to the structure. It should be understood that when a layer is said to be "formed on," "formed below," "disposed on," or "disposed below" another layer, there may be intervening layers formed or disposed between those layers. Conversely, if a layer or material is said to be "formed directly on," "formed directly below," "disposed directly on," "disposed directly below," or "in direct contact with," the materials or layers include no intervening materials or layers therebetween.

When the STT-MRAM cell 50 is selected to be programmed, a programming current is applied to the cell, and the electrons of the current are spin-polarized by the pinned layer to exert a torque on the free layer, which switches the magnetization of the free layer to "write to" or "program" the cell. To initiate the write operation, the read/write circuitry 62 may generate a write current to the bit line 56 and the source line 60. The polarity of the voltage between the bit line 56 and the source line 60 determines the switch in magnetization of the free layer in the structure 52. Furthermore, and as discussed in detail below, incorporating a nonmagnetic material to electrically connect the free and pinned layers may direct a programming current flow through the magnetic cell structure 52 to decrease the cross sectional area of the programming current flow. By decreasing the cross sectional area of the programming current through the free layer, a smaller programming current may still result in a programming current density in the free layer that is greater than the critical switching current density required to switch the magnetization of the free layer. Thus, a smaller programming current may write the STT-MRAM cell 50. Once the free layer is magnetized according to the spin polarity of the programming current, the programmed state is written to the STT-MRAM cell 50.

In a read operation of the STT-MRAM cell 50, a current is used to detect the resistance state of the magnetic cell structure 52. To initiate a read operation, the read/write circuitry 62 generates a read current to the bit line 56 and the source line 60 through the structure 52 and the transistor 54. The programmed state of the STT-MRAM cell 50 depends on the resistance across the structure 52 which may be determined by the voltage difference between the bit line 56 and the source line 60. In some embodiments, the voltage difference may be compared to a reference 64 and amplified by a sense amplifier 66.

Figure 3A:
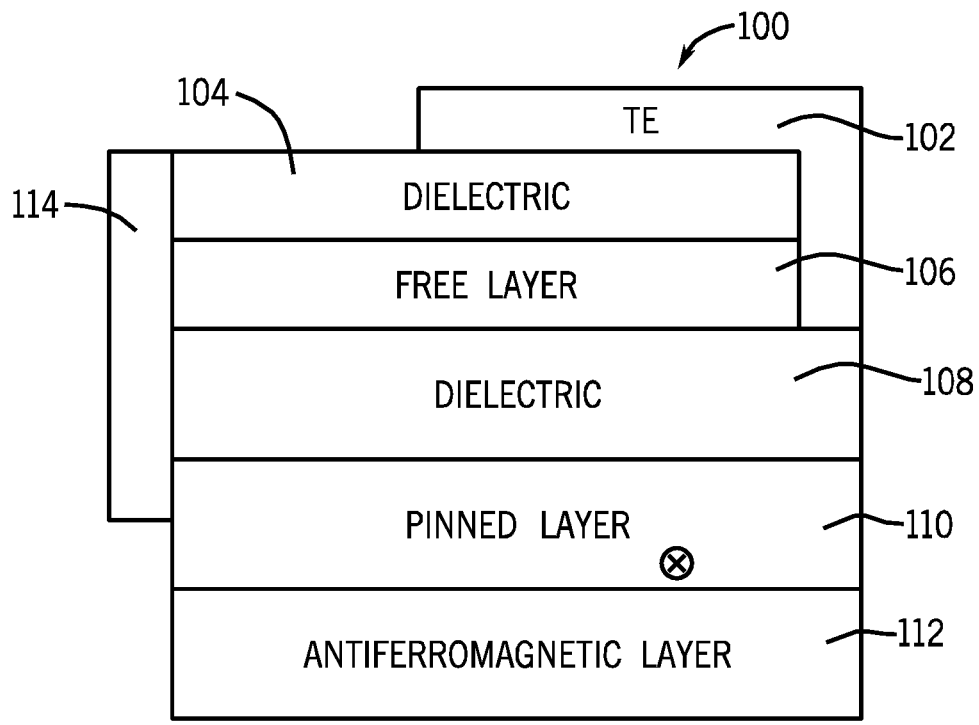
FIG. 3A depicts a magnetic cell structure with a nonmagnetic layer connecting a free layer and a pinned layer in accordance with embodiments of the present invention.
Figure 3B:
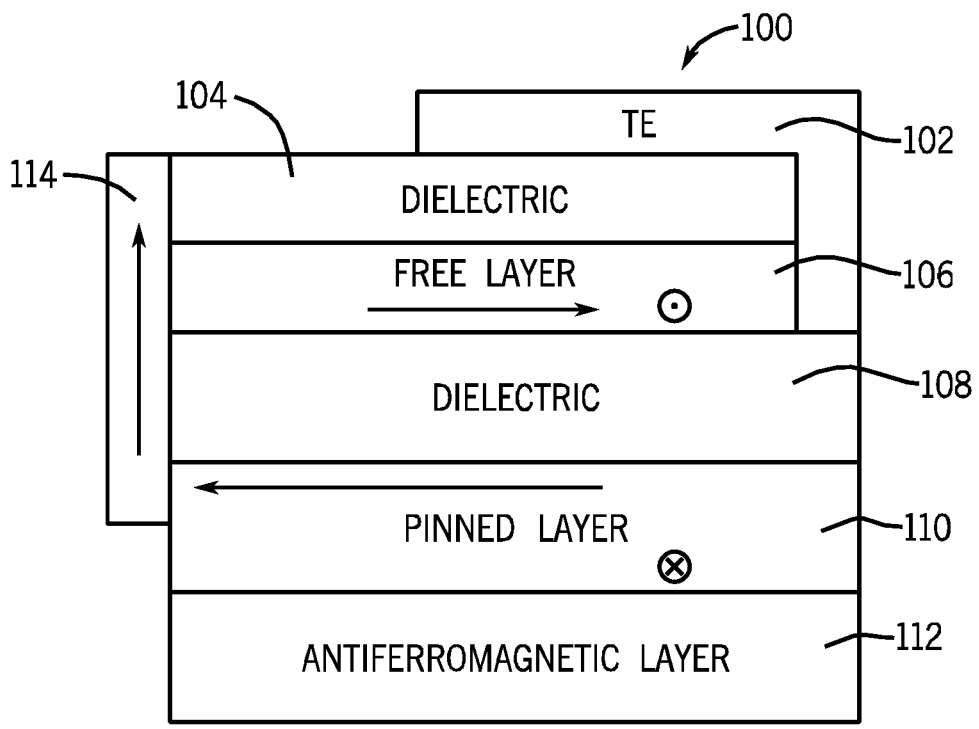
FIG. 3B depicts an example of a current path through the magnetic cell structure of FIG. 3A.

One embodiment of the present techniques for programming a STT-MRAM cell with a decreased programming current, is illustrated in FIGS. 3A and 3B. The STT-MRAM cell includes a memory cell structure 100 having a nonmagnetic layer 114 which may be employed to decrease the cross sectional area of the programming current flow. As will be further explained, this technique enables a lower programming current to facilitate a switch in the magnetization of the free layer 106 to program the memory cell.

The memory cell structure 100 of FIG. 3A may include a free layer 106 and a pinned layer 110 with a dielectric layer 108 in between. The pinned layer 110 is so named because it has a magnetization with a fixed or preferred orientation, and this is represented by the marking indicating that the magnetization of the pinned layer 110 is in a direction into the page. The free layer 106 has a magnetization which may be switched to allow the memory cell to be programmed. As previously discussed, switching the magnetization of the free layer 106 changes the resistance across the free layer 106 and the pinned layer 110 such that the memory cell is programmed to either a low resistance state (when the free layer 106 and the pinned layer 110 have parallel magnetizations) or a high resistance state (when the free layer 106 and the pinned layer 110 have antiparallel magnetizations). The cell may be read by determining the resistance across the free layer 106 and the pinned layer 110.

Switching the magnetization of the free layer 106 occurs when a programming current passed through the memory cell has a current density that is greater than a critical switching current density. Typically, a programming current is applied perpendicularly through the layers of an STT-MRAm cell structure. Since the programming current is flowing axially through the free layer, the programming current density in the free layer would typically be the electric current per cross sectional area, or the electric current in amperes, divided by the width and depth of the free layer. However, as discussed below in accordance with embodiments of the present invention, the programming current can be reduced without departure on the volume of the free layer In one embodiment, a nonmagnetic layer 114 is formed between the free layer 106 and the pinned layer 110. When the cell is selected to be programmed, the programming current may flow through the pinned layer 110 and the nonmagnetic layer 114, and laterally through the free layer 106. The nonmagnetic layer 114 provides electrical connectivity between a side of the pinned layer 110 and a side of the free layer 106. Further, the dielectric layer 108 may provide insulation between the pinned layer 110 and the free layer 106, such that the programming current will flow through the nonmagnetic layer 114 and laterally through the free layer 106, rather than axially through the free layer 106. Since the cross sectional area of the current flow through the free layer 106 would be significantly greater in the axial direction than in the lateral direction, a smaller programming current flowing laterally may have the same current density in the free layer 106 as a comparatively larger programming current flowing axially through the free layer 106.

Referring to the current density relationship previously described, the current density through the free layer 106 when the programming current flows laterally, may be the electric current in amperes, divided by the height and depth of the free layer 106. In some embodiments, the height (or thickness) of the free layer 106 may be smaller than the width of the free layer 106. Consequently, a much smaller programming current may have a sufficient current density when flowing through the free layer 106 to write the STT-MRAM cell. As used herein, the depth may refer to the length of a layer in a direction into the page, and the width may refer to the length of a layer across the page, as may be seen in the side views of the magnetic cell structures in FIGS. 3A, 4A, 5A, 6A, 7A, and 8A. The height may refer to the top to bottom length of a layer. The height may also refer to a thickness of a layer.

FIG. 3B depicts the STT-MRAM cell structure 100 as in FIG. 3A with an example of the programming current flow in accordance with embodiments of the present techniques. The arrows in the structure 100 represent the direction of current flow. The programming current may flow laterally through the pinned layer 110 in a direction to the left, up the nonmagnetic layer 114, and laterally through the free layer 106 in a direction to the right, and then up to the electrode 102. As discussed, the pinned layer 110 may be magnetized to a direction into the page, and as the programming current is flowing laterally to the right through the free layer 106, the spin torque applied to the free layer 106 may magnetize it to a direction out of the page, as indicated by the marking in the free layer 106. Thus, in this example, the pinned layer 110 and the free layer 106 have an antiparallel magnetization, and the STT-MRAM cell has been programmed to a high resistance state.

The structure 100 may also include an antiferromagnetic layer 112 below the pinned layer 110 to achieve the pinning through exchange coupling and further increase cell stability. The structure may also include an electrode 102 making contact to the free layer 106 and another dielectric layer 104 on top of the free layer 106. This embodiment, and each of the embodiments illustrated and described below, may be incorporated into the STT-MRAM cell 50, and further incorporated into an STT-MRAM cell array, as described in FIG. 2.

The examples of materials discussed below may be used in an embodiment as in FIGS. 3A-3B, or in any other embodiment in accordance with the present technique. In some embodiments, the free layer 106 and the pinned layer 110 may comprise ferromagnetic materials, such as Co, Fe, Ni or its alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic material such as Fe3O4, CrO2, NiMnSb and PtMnSb, and BiFeO, for instance. The nonmagnetic layer 114 connecting the free layer 106 and the pinned layer 110 may comprise materials such as Cu, Au, Ta, Ag, CuPt, CuMn, any combination of the above materials, or any other conductive nonmagnetic materials. The dielectric layers 108 and 104 may comprise any insulative material, such as SiN, and may have a thickness of approximately 10 nm-30 nm.

Figure 4A:
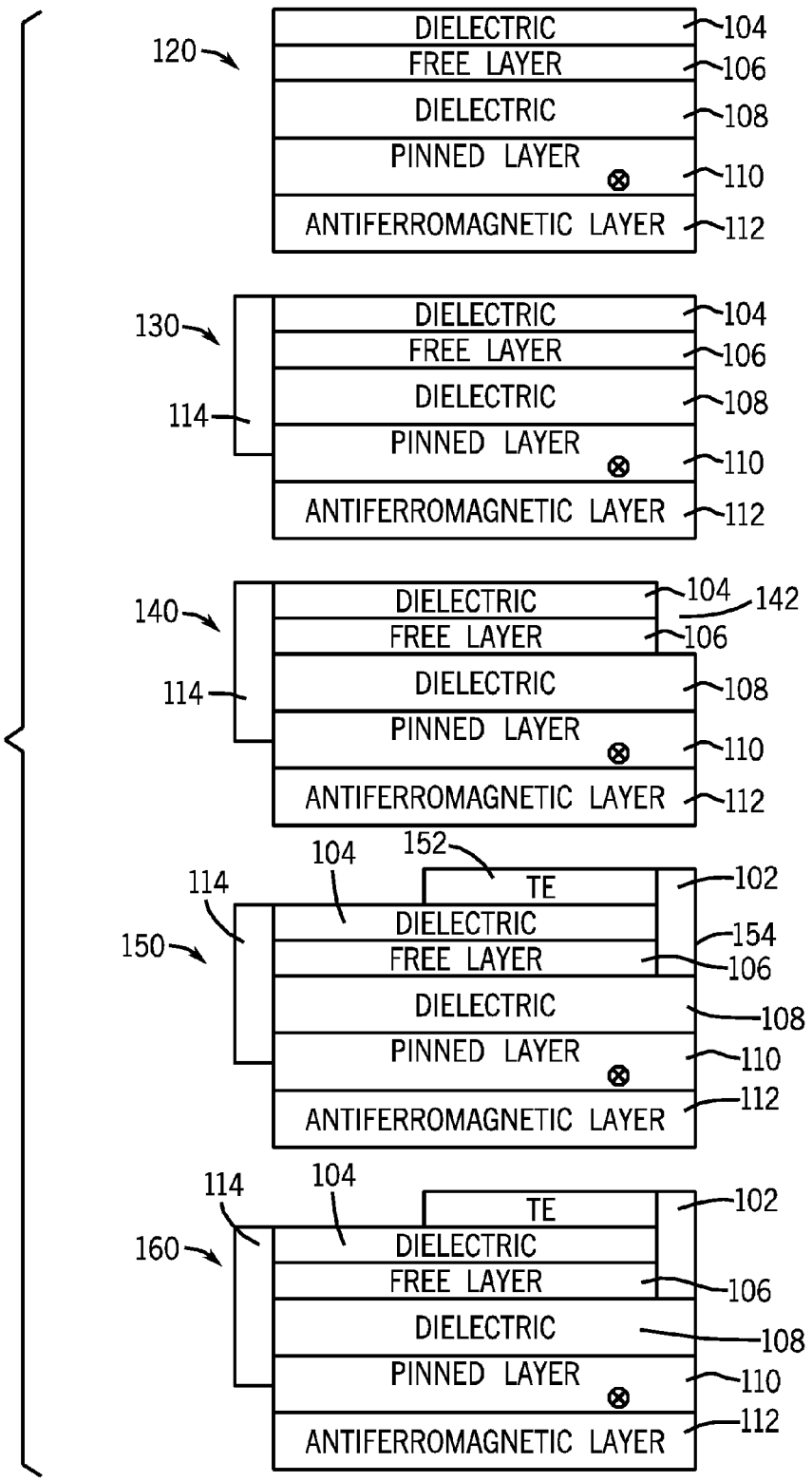

FIG. 4A depicts side views of magnetic cell structures 120, 130, 140, 150, and 160 along different steps in a fabrication process to form the STT-MRAM cell structure 100 depicted in FIGS. 3A and 3B. FIG. 4B depicts top views of two structures 120, 130, 140, 150, and 160 at the different fabrication steps corresponding to the steps in FIG. 4A, and in accordance with an embodiment of the present invention. While the side views depicted in FIG. 4A show one structure 120, 130, 140, 150, and 160 at each step, the top views in FIG. 4B may show two structures 120, 130, 140, 150, and 160 as an example of how more than one structure may be fabricated or arranged in a memory cell array.

In the first step of the fabrication process, a structure 120 comprises a free layer 106 and a pinned layer 110 with a dielectric layer 108 in between. The structure 120 may also have a dielectric layer 104 disposed on the free layer 106 and an antiferromagnetic layer 112 beneath the pinned layer 110. The structure 120 is etched into stripes, stopping at the pinned layer 110. As can be seen from the top view (structure 120 FIG. 4B), the dielectric layer 104 and the pinned layer 110 may be visible, as the structure 120 has been etched down to expose the pinned layer 110. After etching into the pinned layer 110, a nonmagnetic layer 114 may be formed to bridge the free and pinned layer 106 and 110, as seen in the structure 130. The nonmagnetic layer 114 may be formed perpendicular to the free and pinned layers 106 and 110 and may be formed across the insulative dielectric layer 108, forming an electrical path from the pinned layer 110 through the nonmagnetic layer 114 to the free layer 106. As discussed, this electrical path may allow a programming current to flow laterally through the free layer 106, thus enabling a lower programming current to meet the critical switching current density through the free layer 106. The side view of the structure 130 (FIG. 4A) depicts an example of such a perpendicular arrangement, and the top view of the structure 130 (FIG. 4B) may depict two structures 130 back-to-back.

After the nonmagnetic layer 114 is formed, the structure 140 may be etched to form a trench 142 stopping at the dielectric layer 108. As can be seen from the top view of the structure 140, the dielectric layer 108 may be visible after the trench 142 is etched. In the next structure 150 of the fabrication process, an electrode 102 may then be formed in the trench 142 (as in the previously discussed structure 140), and one portion 154 of the electrode may make contact to a side of the free layer 106 while another portion 152 may extend laterally over the dielectric layer 104. This configuration may allow the programming current to flow laterally through the free layer 106 from the nonmagnetic layer 114 at one edge of the free layer 106 to the portion 154 of the electrode 102 at the other edge of the free layer 106. The corresponding top view (FIG. 4B) may depict two structures 150 back-to-back. After the formation of the electrode 102, the cell may be patterned to reduce the cell size and to isolate adjacent cells. As seen in the top view of the patterned structure 160, the cell depth may be decreased when compared with the previously discussed structure 150.

As used herein, "etching" may refer to a chemical removal of layers in the magnetic cell structures (or transitional structures in fabricating the magnetic cell structures). While different etching processes may be discussed (e.g., isotropic etching, dry etching, trench etching, via etching, mesa etching, etc.), any etching procedure, or any procedure suitable for removing layers in the structures may be used in accordance with the present techniques. For example, etching may remove a portion of a dielectric layer to expose one or more of a pinned layer or a free layer. Also as used herein, "forming" may refer to any deposition or growth of a material in the structure. For example, a physical vapor deposition, chemical vapor deposition, conformal chemical vapor deposition, electroplating, or any other suitable deposition may be used to deposit materials, layers, or spacers in the structure. Further, "patterning" may refer to any removal of parts of the structure, using photolithographic techniques, for example. Patterning may be used in the current techniques to reduce the size of a structure or to isolate the structure from adjacent structures in a memory array.

Although the steps described herein may be described sequentially or numbered (e.g., first, second, etc.), the steps may not necessarily be performed in the same order as the sequence or numbering described. Some steps may be performed in a different order, modified, or skipped, or additional steps may be added in accordance with the present techniques.

Figure 5A:
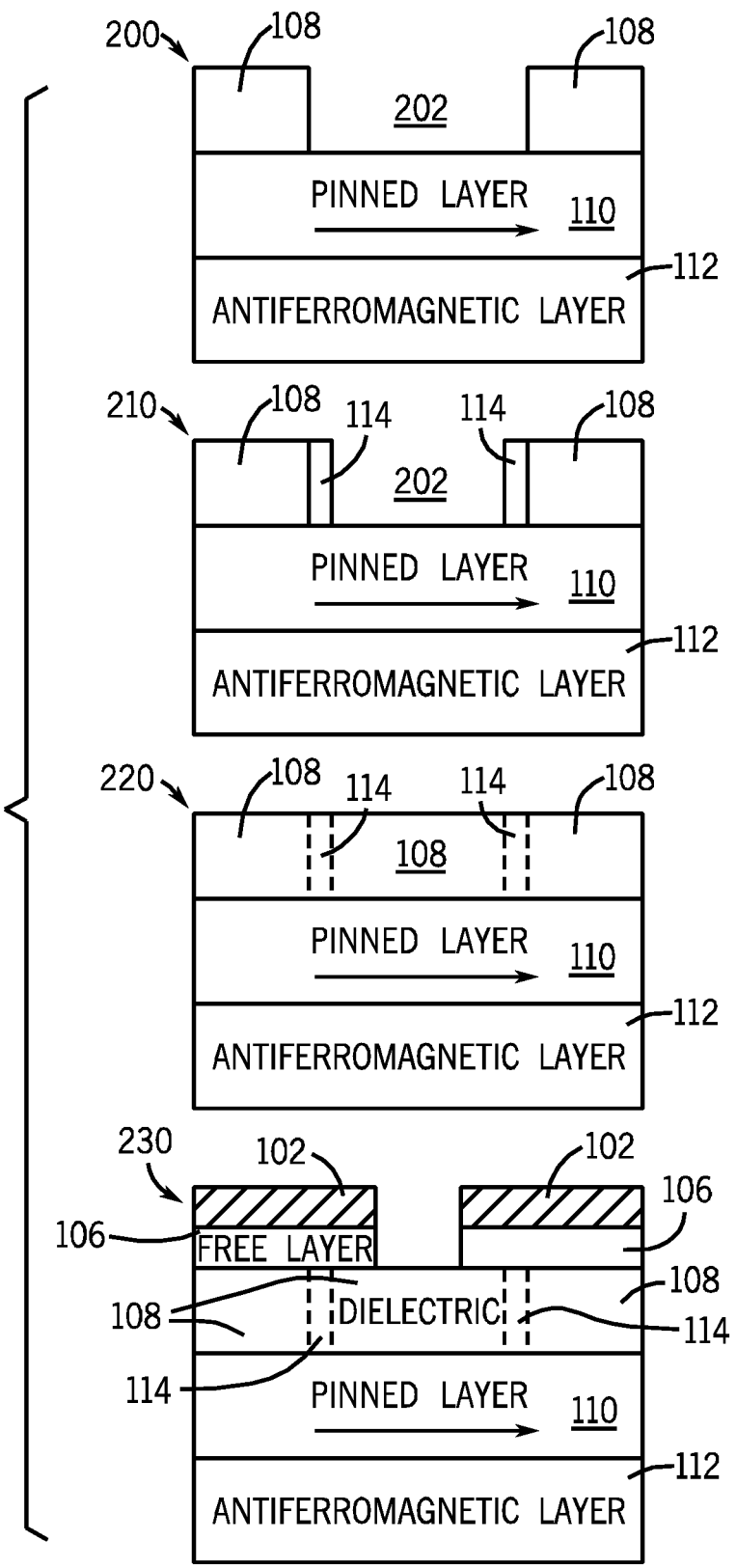
FIGS. 5A and 5B depict side views and top views of fabricating a magnetic cell structure with nonmagnetic material connecting a free layer and a pinned layer in accordance with embodiments of the present invention.
Figure 5B:
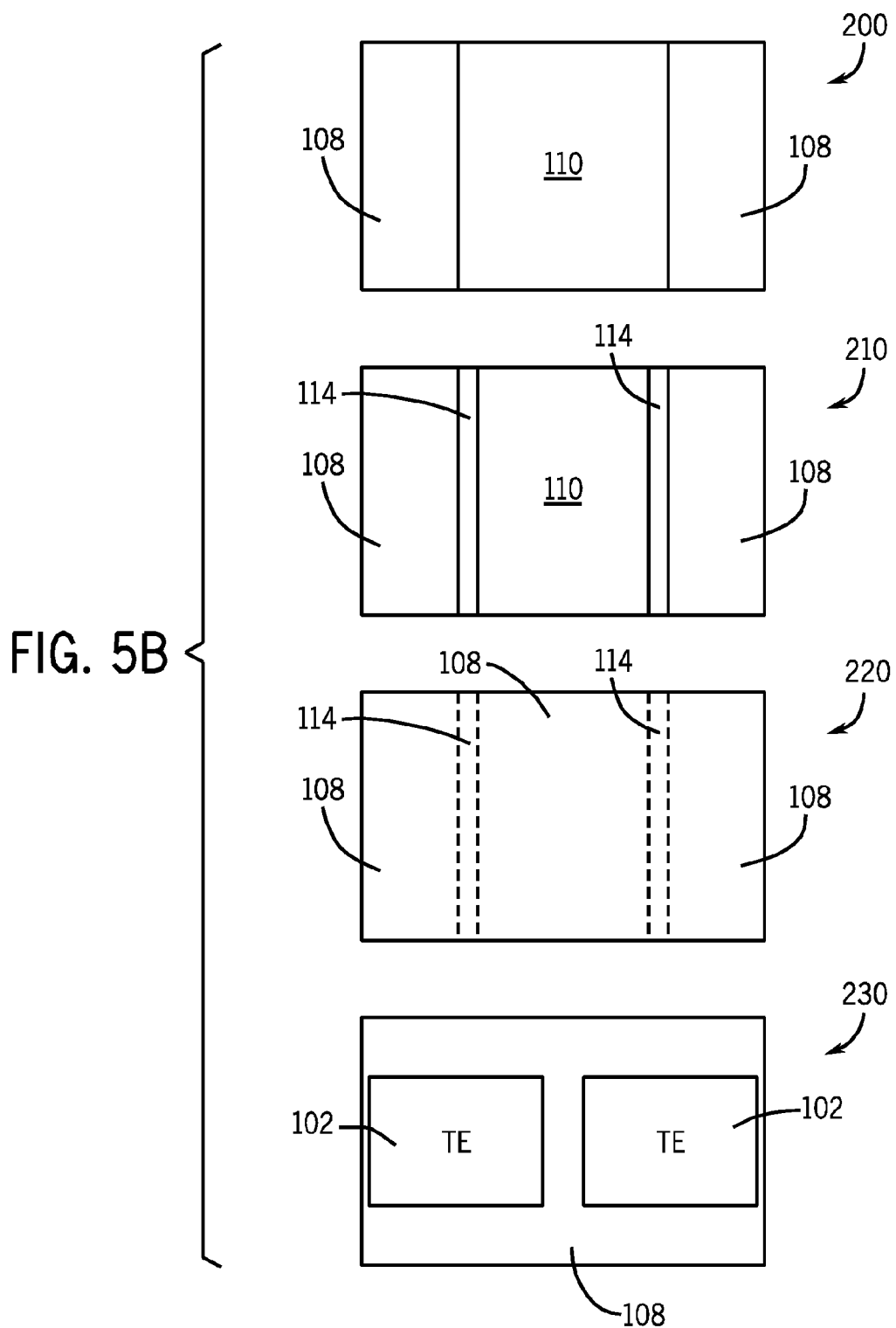

Another embodiment of the present techniques for reducing the programming current required to switch the free layer of an STT-MRAIVI cell, may be depicted in the fabrication steps of FIGS. 5A and 5B. FIG. 5A may depict side views of structures 200, 210, 220, and 230 at different steps in fabrication, and FIG. 5B may depict top views of structures 200, 210, 220, and 230 at the different fabrication steps corresponding to FIG. 5A. The structures 200, 210, 220, and 230 in both FIGS. 5A and 5B may depict two adjacent magnetic cell structures 200, 210, 220, and 230 to give an example of how the magnetic cell structure or an array of structures may be fabricated in accordance with embodiments of the present techniques. The first step may involve etching a trench 202 into the dielectric material 108 of the structure 200. The trench etching may stop at the pinned layer 110, and the top view of the structure 200 may depict that the dielectric material 108 and the pinned layer 110 are visible because the trench 202 has been etched, stopping at the pinned layer 110.

The next structure 210 depicts that a nonmagnetic liner 114 may be formed in the trench 202 along the etched side of the dielectric layer 108. The nonmagnetic liner 114 may be perpendicular to the pinned layer 110. After the nonmagnetic liner 114 is formed, the remaining portion of the trench 202 may be filled with dielectric material 108. As seen in the structure 220, the nonmagnetic liner 114 may be perpendicular to the pinned layer 110 and surrounded on two sides by dielectric material 108. After the dielectric material 108 is filled in the trench 202, the structure 220 may undergo chemical mechanical planarization (CMP), which may expose the top edge of the nonmagnetic liner 114. A free layer 106 may be deposited on top of the dielectric material 108 and may be in contact with the exposed top edge of the nonmagnetic liner 114. An electrode 102 may also be deposited on the free layer 106, as seen in the structure 230. As can be seen in the top view of the structure 230 in FIG. 5B, the structure 230 may be patterned and isolated from adjacent structures 230.

The structure 230 may also be achieved by other fabrication processes. For example, rather than trench etching into the dielectric material 108, and then refilling the dielectric material 108 after the formation of the nonmagnetic liner 114, the dielectric material 108 may be via etched, and nonmagnetic material may be deposited in the spaces to form nonmagnetic liners 114.

In this embodiment, the programming current may flow from the pinned layer 110 through the nonmagnetic liner 114 to the free layer 106. Since the flow of the programming current is limited to the thickness of the nonmagnetic liner 114 prior to flowing through the free layer 106, the cross sectional area of the programming current flow through the free layer 106 may be substantially determined by the thickness of the nonmagnetic liner 114 and the depth of the free layer 106. In this embodiment, though the programming current is still flowing in a direction axial to the free layer 106, the cross sectional area of the current may be less than typical magnetic cell configurations. In typical magnetic cells, the cross sectional area of the programming current through the free layer may be determined by the entire cross section of the free layer in the axial direction (i.e., the width times the depth of the free layer). In the present structure 230, the cross sectional area of the programming current through the free layer 106 may be significantly smaller because the current flows to the free layer 106 from the nonmagnetic liner 114, which has a much smaller cross section (i.e., the width of the nonmagnetic liner 114 times the depth of the free layer 106). Because of the smaller cross sectional area of programming current through the free layer 106, the programming current density in the free layer 106 may also be higher, and so a lower programming current may switch the magnetization of the free layer 106 or a portion of the free layer 106. In some embodiments, the switch of magnetization in a portion of the free layer 106 may also propagate through the rest of the free layer 106 after some period of time.

Switching the magnetization of the free layer 106, or some portion of the free layer 106 may occur when the programming current reaches a critical switching current density in the free layer 106 where the spin torque of the electrons in the programming current may switch the magnetization of the free layer 106 to write the cell to a high or low resistance state. Using the structure 230 in FIG. 5A as an example, if the programming current was flowing upwards in the free layer 106, the current density may be sufficient to switch the magnetization of some portion of the free layer 106 because the smaller cross sectional area of the programming current flow through the portion of the free layer 106. The spin torque of the downward flowing electrons would switch the magnetization in the free layer 106 to the left, such that the pinned layer 110 and the free layer 106 are antiparallel, and the structure 230 is programmed to a high resistance state.

Read operations may also involve sending a read current, which may flow through the cell to determine the resistance between the free layer 106 and the pinned layer 110. As the read current may also flow through the nonmagnetic liner 114 or some other nonmagnetic conductive material in other embodiments in accordance with the present techniques, the path of the read current through the free layer 106 may also be limited to an area that is approximately the width of the nonmagnetic liner 114 and the depth of the free layer 106. Therefore, the read current may measure the resistance of the structure 230 through the portion of the free layer 106 that has been switched by the programming current.

Figure 6A:
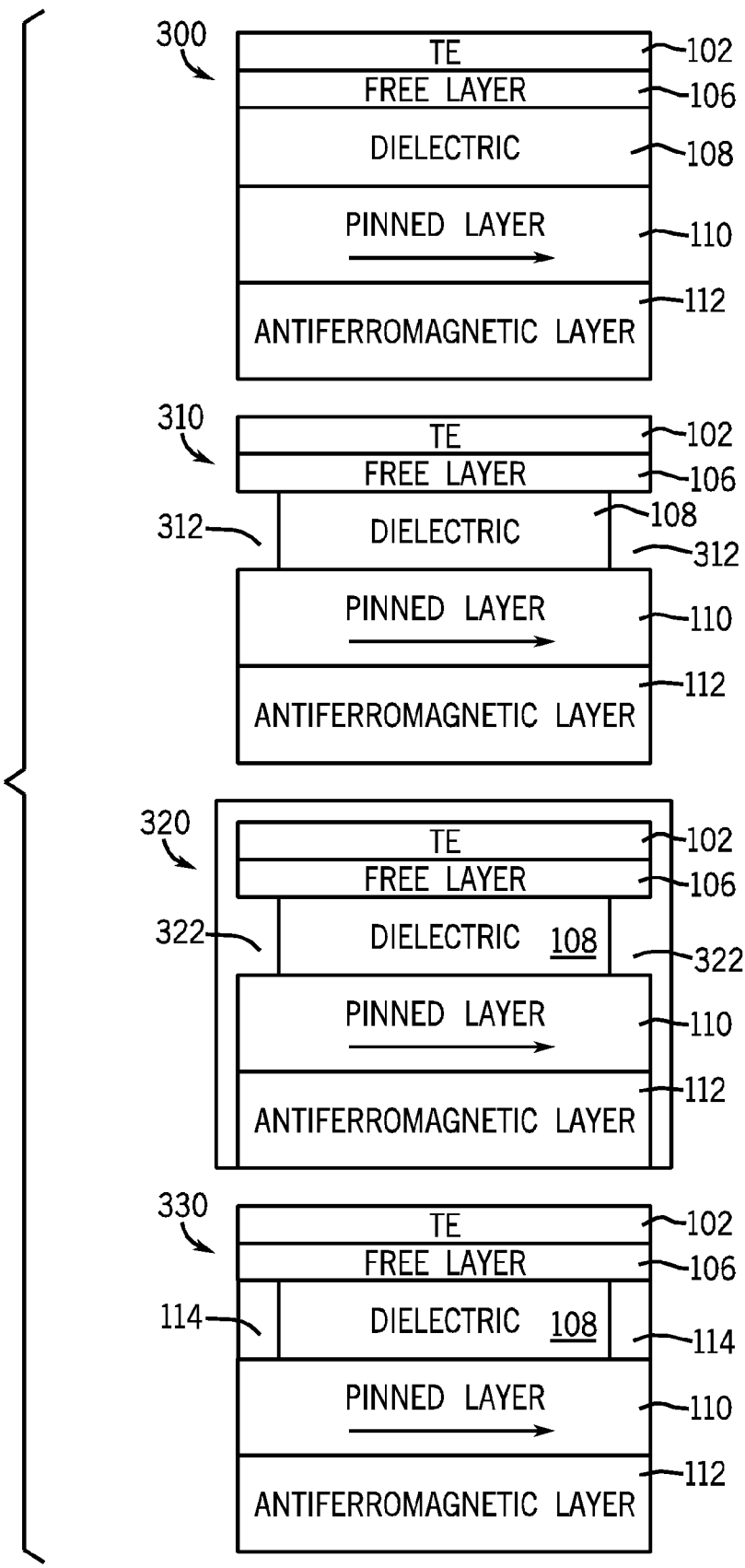

FIGS. 6A and 6B may depict another embodiment of the present techniques where a nonmagnetic layer 114 may be formed on the side of a dielectric layer 108 in a magnetic cell structure to electrically connect the free and pinned layers 106 and 110. FIG. 6A may depict side views of structures 300, 310, 320, and 330 at different steps in fabrication, and FIG. 6B may depict top views of structures 300, 310, 320, and 330 at the different fabrication steps corresponding to FIG. 6A.

A magnetic cell structure 300 may be first isolated into individual cells by etching. The individual structure 300 may be in an oval shape, as depicted in the structure 300 of FIG. 6B, or in any other shape in accordance with the present techniques. Each structure 300 may include a free layer 106 and a pinned layer 110 with a dielectric layer 108 in between. An electrode 102 may be disposed on the free layer 106, and an antiferromagnetic layer 112 may be beneath the pinned layer 110.

After the structure 300 is etched into individual structures 300, a recess 312 may be formed in the dielectric layer 108, under the free layer 106. For example, an isotropic etch procedure may be used to form this recess 312. As the recess 312 is below the free layer 106 and the top electrode 102, the recess 312 may not be seen from the top view of the structure 310, but an example of where the recess 312 may be located beneath the top electrode 102 is depicted by the outlined recessed portion 314 in the structure 310 of FIG. 6B.

Conductive nonmagnetic material 322 may be deposited such that it surrounds the surfaces of the structure 320, including the recess 312 (as in structure 310). The deposition may be by conformal chemical vapor deposition (CVD), for example, or by any other method in accordance with the present techniques. A top view of the structure 320 may show that the entire structure 320 is covered by the conductive nonmagnetic material 322. Unwanted portions of the nonmagnetic material 322 may be removed by isotropic etching to produce a structure 330 with a thin nonmagnetic layer 114 remaining in the recess 312 (as in the previous structure 310). A top view of the structure 330 may only show the top electrode 102 of the structure 330.

In this embodiment, the cross sectional area of the programming current through the free layer 106 may be limited by the small cross sectional area of the current path immediately before entering the free layer 106. More specifically, the programming current flows from the pinned layer 110 through the nonmagnetic layer 114 before reaching the free layer 106. As the cross sectional area of the programming current is small (i.e., limited to the cross sectional area of the nonmagnetic layer 114) immediately before reaching the free layer 106, the cross sectional area of the programming current may also be small in the free layer 106. The cross sectional area of the programming current through the free layer may be approximated by the circumference of the structure 330 and the thickness of the nonmagnetic layer 114. Thus, a smaller programming current may have a larger current density in the portion of the free layer 106 through which the current travels than if the programming current were traveling axially through the entire cross sectional area of the free layer 106.

Figure 7A:
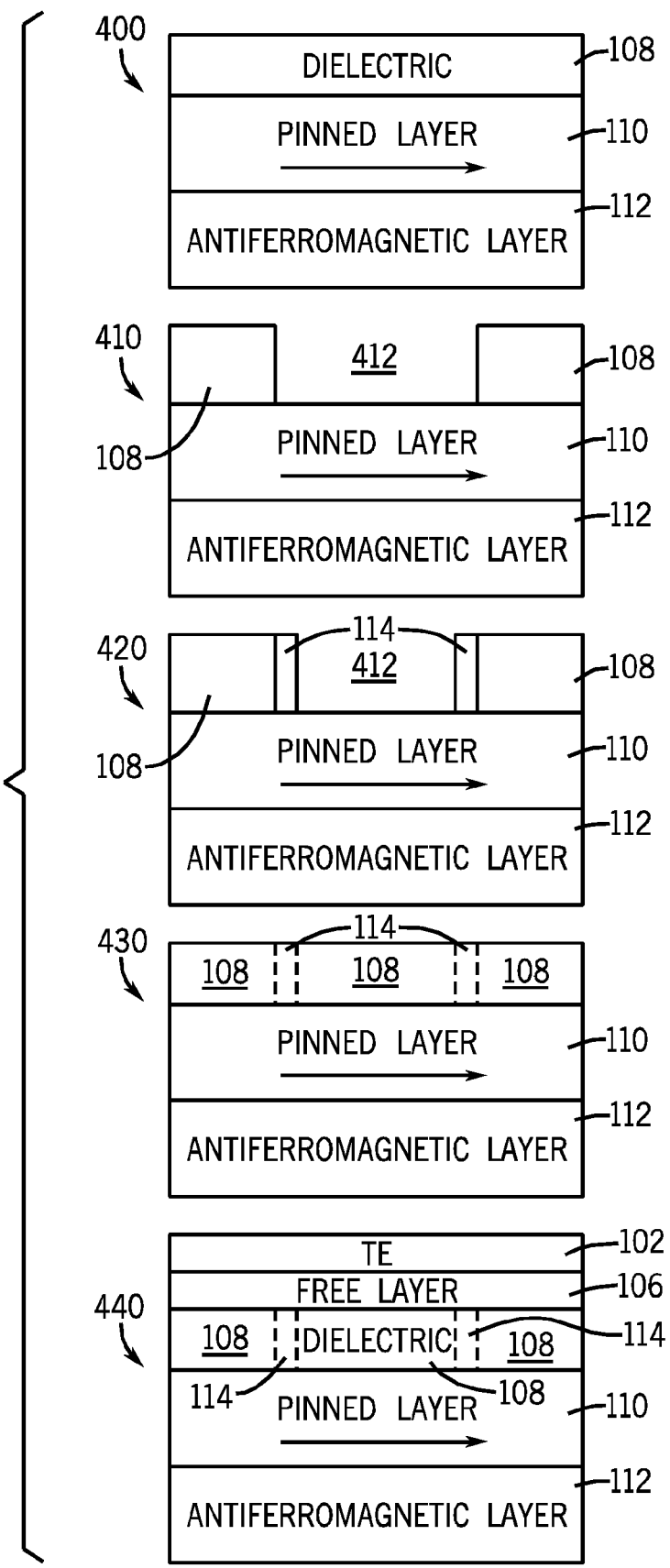
FIGS. 7A and 7B depict side views and top views of one method of fabricating yet another magnetic cell structure with nonmagnetic material connecting a free layer and a pinned layer in accordance with embodiments of the present invention.

FIGS. 7A-8B depict another embodiment of the present techniques, where a nonmagnetic layer 114 is formed within a magnetic cell structure to electrically connect the free layer 106 and the pinned layer 110. FIGS. 7A and 7B may depict side views and top views of structures 400, 410, 420, 430, and 440 in different steps of one fabrication method for creating this embodiment, and FIGS. 8A and 8B may depict side views and top views of structures 450, 460, 470, 480, and 490 of another fabrication method for creating this embodiment.

Figure 7B:
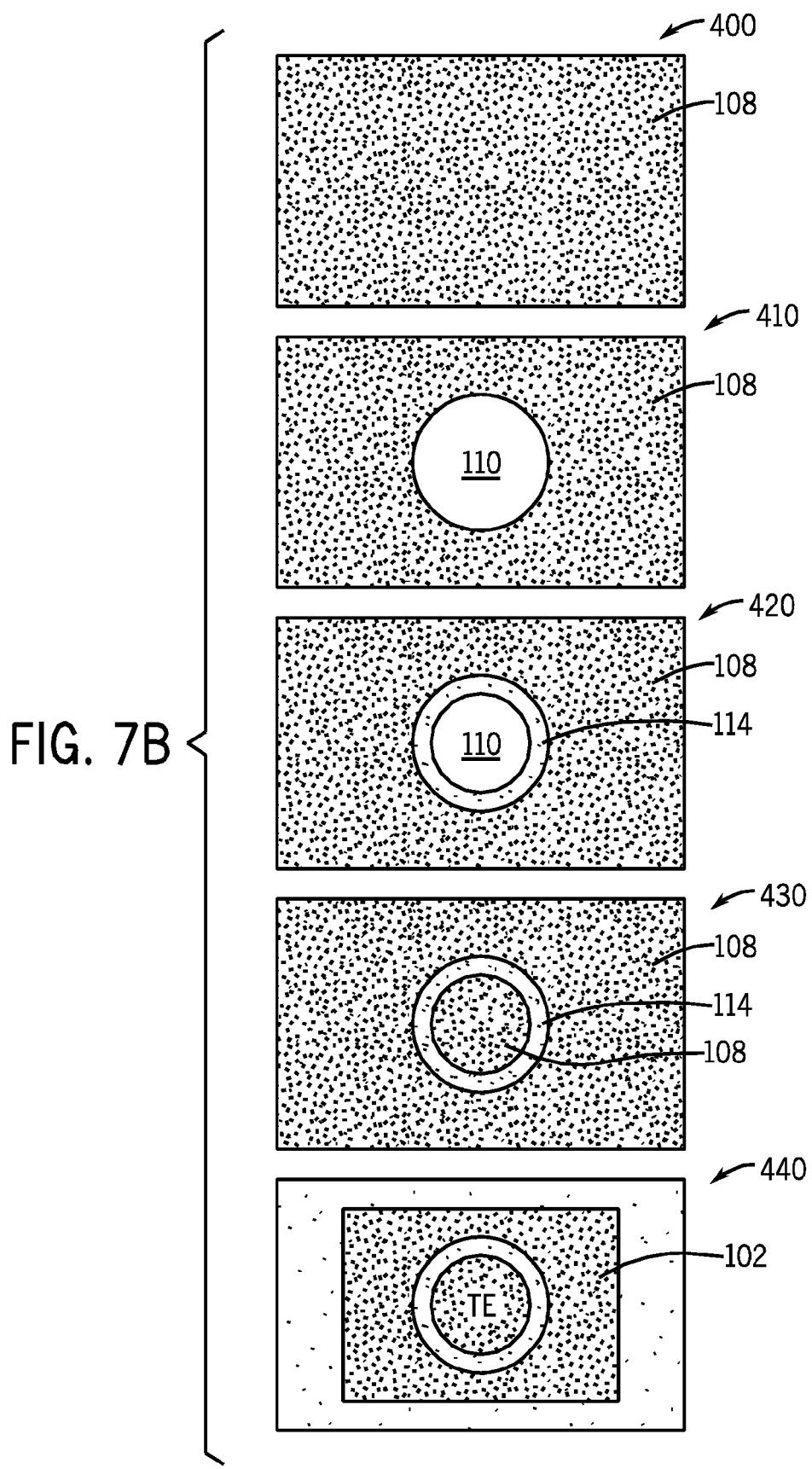

Referring first to FIGS. 7A and 7B, the structure 400 may include a dielectric layer 108 on top of a pinned layer 110. An antiferromagnetic layer 112 may also be beneath the pinned layer 110. A top view of the structure 400 (in FIG. 7B) may show that the dielectric layer 108 is visible. The fabrication method may include via etching into the dielectric layer 108, stopping on the pinned layer 110 to form the structure 410 in the next step of the fabrication. From the side view, a recess 412 may be seen in the structure 410, and from the top view, the pinned layer 110 may be visible through the portion of the dielectric layer 108 removed by etching. Via etching may produce a recess 412 in various shapes within the structure 410, including the circular shape as depicted in the top view of the structure 410. Nonmagnetic material may be formed in the recess 412 to form a nonmagnetic spacer 114. The nonmagnetic spacer 114 may be formed along the edge of the recess 412 so that it is in contact with and perpendicular to the pinned layer 110, as seen from the top view of the structure 420 in FIG. 7B. After the nonmagnetic spacer 114 is formed along the edge of the recess 412, the remaining portion of the recess 412 may be filled with dielectric material 108. The fabrication process may include planarizing by CMP such that the nonmagnetic spacer 114 in the resulting structure 430 may be exposed at the top edge. As may be seen in the top view of the structure 430, the nonmagnetic spacer 114, which is surrounded by the dielectric layer 108, may have a visible top edge.

After planarization, a free layer 106 may be deposited on the dielectric layer 108 with the exposed nonmagnetic spacer 114, and an electrode layer 102 may be disposed on the free layer 106. The resulting structure 440 may be patterned such that the structure 440 may be isolated from other structures or other memory cells. The top view of the structure 440 in FIG. 7B depicts an example of how one magnetic cell structure 440 may appear after patterning. While only the top electrode layer 102 may be visible from the top view, this figure depicts an outline of a ring, which may represent the position of the underlying nonmagnetic spacer 114.

Figure 8A:
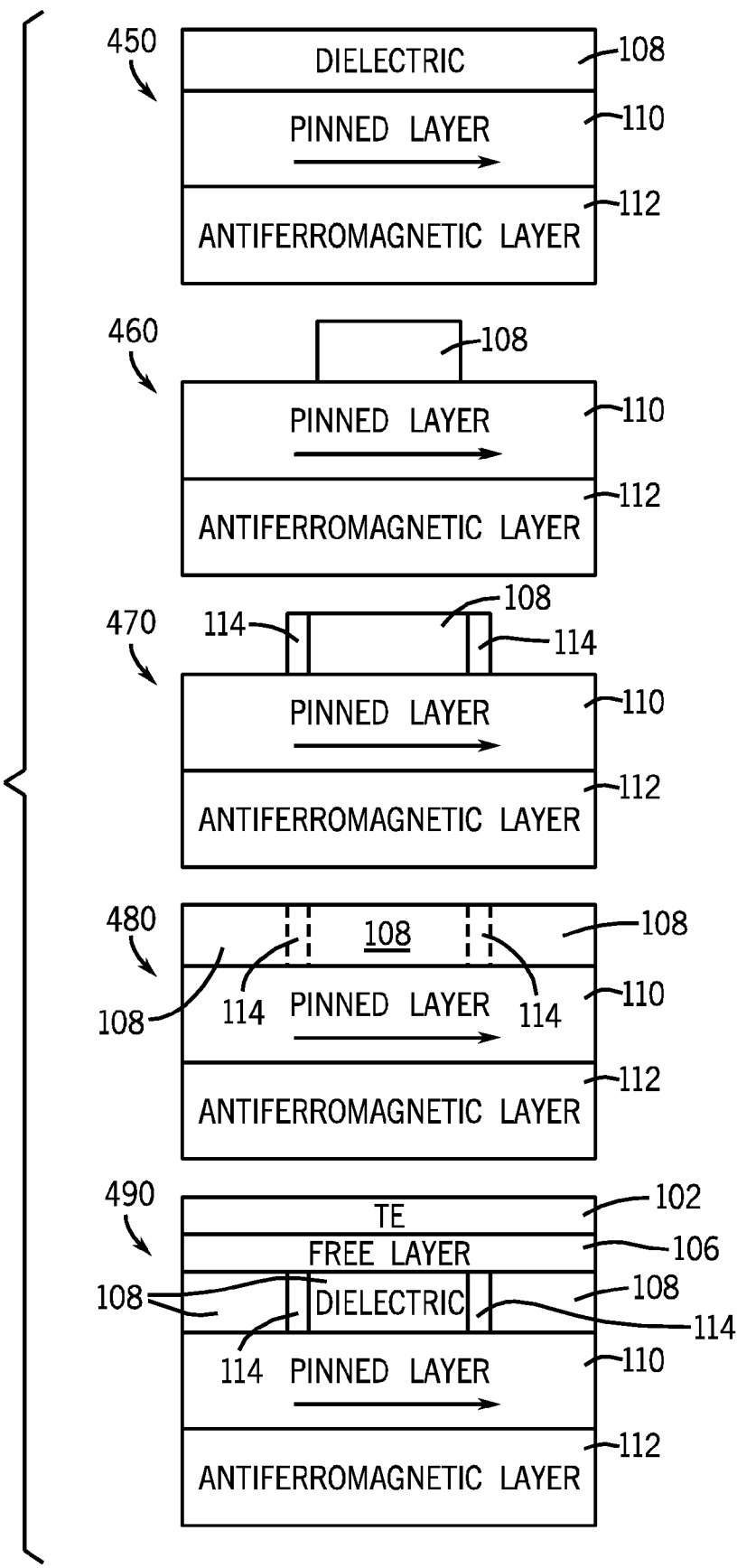

Referring now to FIGS. 8A and 8B, the structure 450 may include a dielectric layer 108 on top of a pinned layer 110. An antiferromagnetic layer 112 may also be beneath the pinned layer 110. A top view of the structure 450 (in FIG. 8B) may show that the dielectric layer 108 is visible. The fabrication method may include etching the dielectric layer 108 into a mesa, and stopping on the pinned layer 110, as seen in the next structure 460 of the fabrication process. As can be seen from the top view of the structure 460, the etching may stop on the pinned layer 110 so that it is visible around the mesa, or the remaining portion of the dielectric layer 108. The dielectric mesa 108 may be in any shape, including the round shape depicted in the top view of the structure 460. A nonmagnetic spacer 114 may then be formed along the side of the dielectric mesa 108, and may be perpendicular to the pinned layer 110. The top view of this structure 470 depicts the nonmagnetic spacer 114 around the side of the dielectric mesa 108, which may resemble a ring around a round dielectric mesa 108. The next step in the fabrication may involve depositing dielectric material 108 to surround the nonmagnetic spacer 114 of the structure 480, and a top view of the structure 480 shows that the nonmagnetic spacer 114 may be surrounded by the dielectric layer 108 such that only the top edge of the nonmagnetic spacer 114 is revealed. The free layer 106 is then deposited on the dielectric layer 108 and the nonmagnetic spacer 114. As the top edge of the nonmagnetic spacer 114 was exposed, the nonmagnetic spacer 114 may serve as a bridge between the pinned layer 110 and the free layer 106. An electrode layer 102 may be disposed on the free layer 106. The structure 490 may be patterned to isolate the cell stack, as may be seen by the top view of the structure 490 in FIG. 8B.

In the embodiments of FIGS. 7A-8B, the cross sectional area of the programming current through the free layer 106 may be limited by the small cross sectional area of the current path immediately before entering the free layer 106. More specifically, the programming current flows from the pinned layer 110 through the nonmagnetic spacer 114 before reaching the free layer 106. The cross sectional area of the programming current is small immediately before reaching the free layer 106, as the cross sectional area of the programming current in the nonmagnetic spacer 114 is limited to the area of the thin ring shape. Thus, the cross sectional area of the programming current may also be small in the free layer 106 and may be approximated by the circumference of the nonmagnetic spacer 114 and the thickness of the nonmagnetic spacer 114. A smaller programming current may then have a larger current density in the portion of the free layer 106 through which the current travels than if the same programming current were traveling axially through the entire cross sectional area of the free layer 106.

As previously explained, the programming current must reach some current density in the free layer 106 such that the spin torque of the electrons in the programming current may switch the magnetization of the free layer 106 to write the cell to a high or low resistance state. Using the structure 490 in FIG. 8A as an example, if the programming current was flowing up to the free layer 106, the current density may be sufficient to switch the magnetization of the free layer because the cross sectional area of the programming current through the free layer 106 is smaller. The spin torque of the downward flowing electrons would switch the magnetization in the free layer 106 to the left, such that the pinned layer 110 and the free layer 106 are antiparallel, and the structure 490 is programmed to a high resistance state.

Read operations may also involve sending a read current, which may travel through the cell to determine the resistance between the free layer 106 and the pinned layer 110. As the read current may also pass through the nonmagnetic spacer 114, the read current may read the resistance of the structure across the portion of the free layer 106 that has been switched by the programming current.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of operating a memory cell comprising:
   directing a programming current through a free layer in the memory cell such that a cross sectional area of the programming current through the free layer is smaller than the cross section of the memory cell; and
   programming the memory cell.

2. The method, as set forth in claim 1, wherein the cross sectional area of the programming current through the free layer of the memory cell is smaller than the axial cross section of the free layer.

3. The method, as set forth in claim 1, wherein directing a programming current through the free layer comprises directing the programming current to flow laterally in the free layer, wherein a lateral cross section of the free layer is smaller than an axial cross section of the free layer.

4. The method, as set forth in claim 1, comprising:
   directing the programming current to flow through a nonmagnetic bridge, wherein a cross section of the nonmagnetic bridge is smaller than a cross section of the memory cell.

5. The method, as set forth in claim 4, wherein the programming current is directed from a pinned layer in the memory cell, through the nonmagnetic bridge, and through the free layer.

6. The method, as set forth in claim 4, wherein the cross sectional area of the programming current through the free layer is approximately the cross section of the nonmagnetic bridge.

7. The method, as set forth in claim 4, wherein the nonmagnetic bridge is a nonmagnetic layer, a nonmagnetic spacer, or a nonmagnetic liner in the memory cell.

8. The method, as set forth in claim 1, wherein the memory cell is programmed when a density of the programming current through the free layer is high enough to switch a magnetization of the free layer to be either parallel or antiparallel to a magnetization of a pinned layer in the memory cell.

9. A method of operating a memory cell comprising:
   directing a programming current through a magnetic cell structure comprising a pinned ferromagnetic layer, a free ferromagnetic layer and an intermediate layer formed therebetween, wherein the programming current is directed through the free ferromagnetic layer through a nonmagnetic bridge having a cross sectional area that is smaller than the cross section of the magnetic cell structure; and
   programming the memory cell.

10. The method, as set forth in claim 9, wherein directing a programming current through the magnetic cell structure comprises directing the programming current through a magnetic tunnel junction (MJT).

11. The method, as set forth in claim 9, wherein directing a programming current through the magnetic cell structure comprises directing the programming current through a spin valve structure.

12. The method, as set forth in claim 9, wherein the nonmagnetic bridge is formed inside the intermediate layer.

13. The method, as set forth in claim 9, wherein the nonmagnetic bridge is surrounding the intermediate layer.

14. The method, as set forth in claim 9, wherein the nonmagnetic bridge comprises Cu, Au, Ta, Ag, CuPt, CuMn, or any combination thereof.

15. The method, as set forth in claim 9, wherein the nonmagnetic bridge comprises a conductive material.

16. A method of operating a memory cell comprising:
   directing a programming current between a free layer of the memory cell and a pinned layer of the memory cell through a nonmagnetic bridge coupled to each of the free layer and the pinned layer, wherein a cross sectional area of the programming current through the nonmagnetic bridge is smaller than a cross sectional area of the free layer; and
   programming the memory cell.

17. The method, as set forth in claim 16, wherein the programming current is directed from a pinned layer in the memory cell, through the nonmagnetic bridge, and through the free layer.

18. The method, as set forth in claim 16, wherein the cross sectional area of the programming current through the free layer is approximately the cross section of the nonmagnetic bridge.

19. The method, as set forth in claim 16, wherein the nonmagnetic bridge is a nonmagnetic layer, a nonmagnetic spacer, or a nonmagnetic liner in the memory cell.

20. The method, as set forth in claim 16, wherein the memory cell is programmed when a density of the programming current through the free layer is high enough to switch a magnetization of the free layer to be either parallel or antiparallel to a magnetization of a pinned layer in the memory cell.

* * * * *